United States Patent [19]

Seieroe et al.

[11] Patent Number: 5,117,068
[45] Date of Patent: May 26, 1992

[54] SURFACE MOUNT PACKAGE FOR R.F. DEVICES

[75] Inventors: Louis M. Seieroe; Kenneth S. Ledford, both of Santa Clara County, Calif.

[73] Assignee: Watkins-Johnson Company, Palo Alto, Calif.

[21] Appl. No.: 570,121

[22] Filed: Aug. 17, 1990

[51] Int. Cl.$^5$ .................................. H01L 23/02
[52] U.S. Cl. ..................... 174/52.4; 357/74; 361/392
[58] Field of Search ............... 361/400, 401, 404, 405, 361/406, 421, 399, 380, 392; 357/74; 174/52.4, 52.5, 52.3

[56] References Cited

U.S. PATENT DOCUMENTS

| | | | |
|---|---|---|---|
| 4,287,772 | 9/1981 | Mounteer et al. | 73/720 |
| 4,644,096 | 2/1987 | Gutierrez et al. | 174/52.5 |
| 4,649,229 | 3/1987 | Scherer et al. | 174/52.4 |
| 4,990,720 | 2/1991 | Kaufman | 174/52.4 |

Primary Examiner—Leo P. Picard
Assistant Examiner—Bot Lee Ledynh
Attorney, Agent, or Firm—Flehr, Hohbach, Test, Albritton & Herbert

[57] ABSTRACT

A TO-8 surface-mount package assembly for R.F. and microwave devices is disclosed. The assembly includes a lead-frame positioned beneath an alumina base. The alumina base supports a number of solid metal vias. The vias electrically connect the lead-frame to an R.F. or microwave device which is attached to the vias. The assembly also includes a gold plated Kovar seal-ring positioned over the base. The seal-ring and base are brazed together. A cover is then positioned over the seal-ring and welded to the seal-ring.

8 Claims, 2 Drawing Sheets

SURFACE MOUNT PACKAGE FOR R.F. DEVICES

BRIEF DESCRIPTION OF THE INVENTION

This invention relates to a surface mount package for R.F. and microwave components such as amplifiers, attenuators, mixers and limiters; and more particularly to a TO-8 package which can be surface mounted to form R.F. and microwave hybrid circuits.

BACKGROUND OF THE INVENTION

Elaborate circuit boards and manual assembly techniques are presently required to interconnect conventionally packaged R.F. and microwave components in hybrid circuits. Surface mount technology obviates these problems. Surface mounted components are compatible with automated assembly equipment, thereby avoiding the expense of manual assembly techniques. The surface mounted components also allow for enhanced assembly density. Surface mounted devices are rugged, and therefore can be used in commercial and military environments.

While surface mount digital ICs and passive devices have been in use for some time, the use of surface mount technology for R.F. and microwave components has been more difficult to realize. In R.F. and microwave applications, the transmission mediums and device interconnection behavior are of greater concern since they introduce inductance and capacitance which represents serious obstacles to system performance. In addition, a surface mount assembly places additional constraints on design because the assembly may have a different coefficient of thermal expansion than the printed wiring board material on which it is mounted.

OBJECTS AND SUMMARY OF THE INVENTION

It is an object of this invention to provide a surface mount TO-8 package.

It is another object of the invention to provide a surface mount TO-8 package which will facilitate automated assembly of packaged components to form R.F. and microwave assemblies, thereby reducing the cost for R.F. and microwave systems.

Another object of the invention is to provide a rugged TO-8 package.

These and other objects are achieved by a surface mount TO-8 package for R.F. and microwave devices which includes a lead-frame carried on one face of an alumina base. The alumina base is provided with a number of solid metal vias which extend from said one face to the other face. The vias electrically connect the lead-frame to an R.F. or microwave device which is mounted on the other face within the package. A gold plated Kovar seal-ring is sealed onto the other face of the base and a cover is sealed to the seal-ring and defines, with the base and seal-ring, a sealed housing for the mounted R.F. or microwave components.

BRIEF DESCRIPTIONS OF THE DRAWINGS

Other objects and advantages of the invention will become apparent upon reading the following detailed description and upon reference to the drawings, in which.

DETAILED DESCRIPTION OF THE INVENTION

Figure 1:
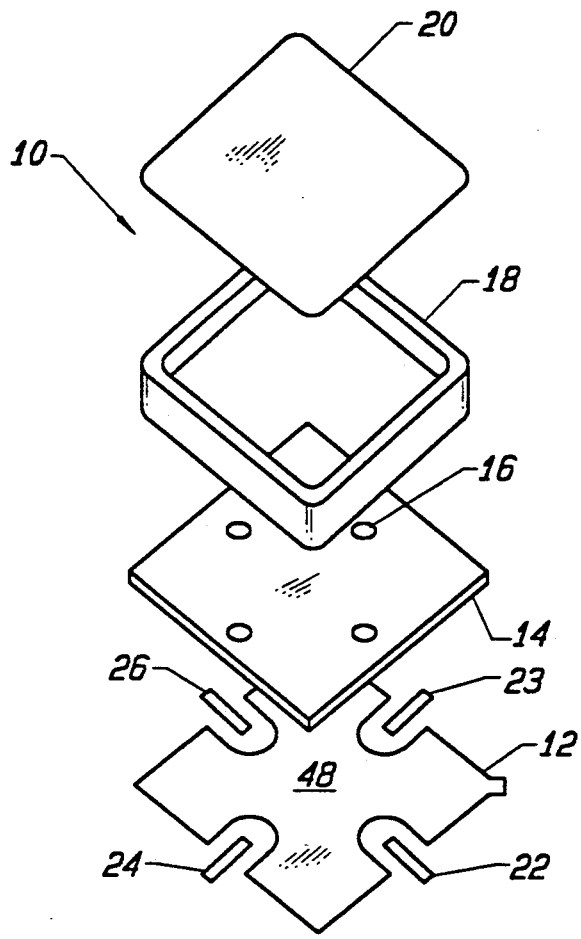
FIG. 1 is an exploded perspective view of one embodiment of the surface mount package assembly of the invention.
Figure 2:
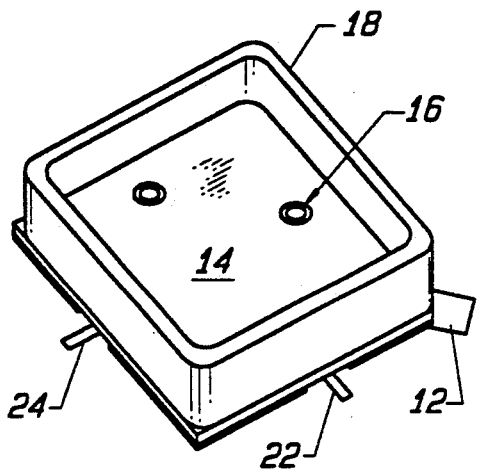
FIG. 2 is a partly assembled perspective view of the surface mount package assembly of FIG. 1.
Figure 3:
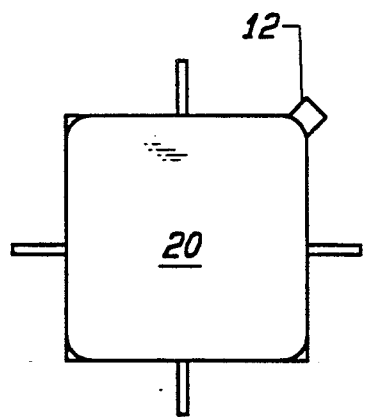
FIG. 3 is a top view of the assembled surface mount package assembly of FIG. 1.
Figure 4:
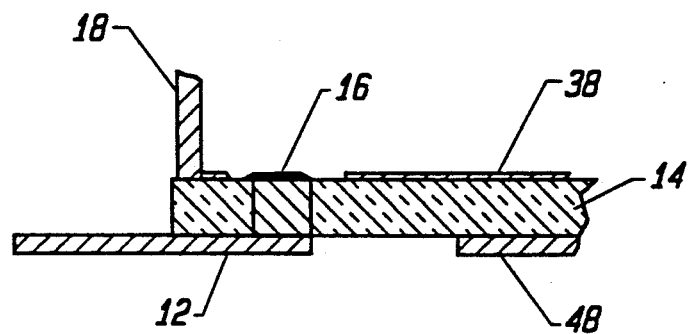
FIG. 4 is a cross-sectional view of the package showing an interconnect via.

An exploded view of the surface mount TO-8 package assembly in accordance with the invention is depicted in FIG. 1. Other views are shown in FIGS. 2, 3 and 4 and bear like reference numbers. The R.F. surface mount assembly 10 includes a gold plated nickel alloy 42 lead-frame 12, an alumina base 14 which includes solid metal vias 16 extending therethrough, a seal-ring 18 made of a gold plated Kovar and a nickel cover 20. The lead-frame and the seal-ring are brazed to each face of the alumina base using a high-temperature braze. This partially assembled package is shown in FIG. 2.

After mounting of R.F. or microwave components, the package cover is parallel-seam welded to form a sealed package.

The solid metal vias 16 are fired into the alumina base and serve as the electrical connection between the inside of the package and the external leads. The vias 16 eliminate the glass-to-metal seals of the prior art.

The vias 16 and the brazing provide a mechanically strong and temperature resistant package that more readily withstands hermeticity, salt spray, and humidity of military environments. The square outline of the package is conducive to automated pick-and-place equipment.

The lead-frame 12 which matches the lead-frame of a conventional TO-8 includes outwardly extending leads such as input, output and bias leads 22, 23, 24 and 26. The outwardly extending leads eliminate the need to bend the leads as in conventional packages. This feature reduces the effective mounting area and mechanical damage that occurs in the bending process. If visible solder joints are not a requirement, the leads may be sheared flush with the base of the package to achieve a greater component density on the board.

An enlarged sectional side view of assembly 10 is shown in FIG. 4. The FIG. shows a gold plated nickel alloy 42 lead-frame 12 formed on the face of alumina base 14. It also shows the solid metal via 16 and gold plated Kovar seal-ring 18. The FIG. shows one of the outwardly extending leads, which may be any lead previously described. The FIG. also discloses a gold plated film 38 on the other face of the base which serves as a ground plane and bonding pad for a device mounted in the package and connected to the vias.

Figure 5:
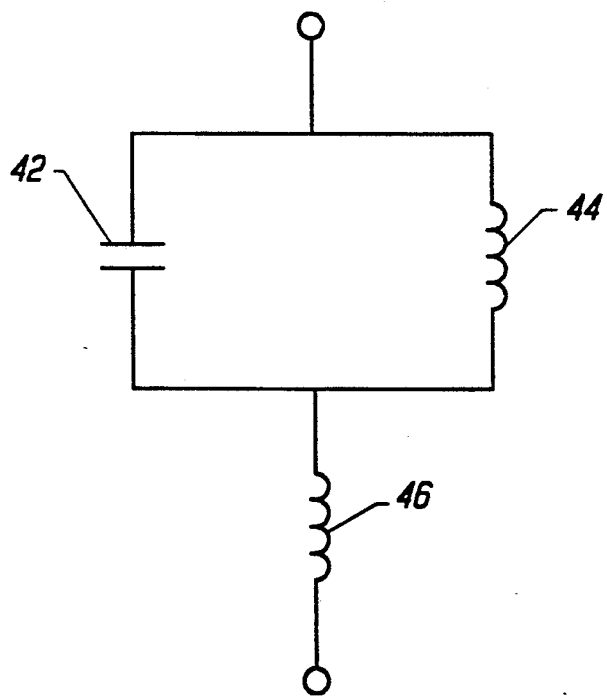
FIG. 5 is an electrical model of the apparatus depicted in FIG. 4.

The assembly 10 can be modeled as a combination of series and shunt reactive elements. An electrical schematic of the device of FIG. 4 is disclosed in FIG. 5. Capacitor 42 represents the capacitance of the alumina substrate. Inductor 44 represents the inductance of the via 16 while inductor 46 models the inductance of the outwardly extending lead.

The inductance of inductor 44 is directly related to the diameter of the via 16. This inductance is the limiting factor in the upper cut-off frequency of the assembly 10. As the diameter of the via is increased, the inductance is lowered and the assembly 10 will exhibit less loss. The diameter, however, is constrained by the size of the overall bonding area and the ability to manufacture the part.

The capacitance of capacitor 42 needs to be minimized for the same reason. This is accomplished by the use of grounded vias located as close as possible to the interconnect vias 16. This approach decreases the capacitance by moving the ground plane 48 on the bottom of the assembly 10, FIG. 1, closer to the ground plane 38 on the inside.

In summary, the insertion loss of the assembly 10 is improved by reducing the shunt capacitance and series inductance, which cause high frequency roll-off. By keeping a good impedance match between the package and its mounting surface and the package inter-connections, the return loss will be improved.

Thus, this feed-through design allows for electrical performance comparable to that obtained with prior art TO-8 devices which do not enjoy the benefits of surface mount technology. For instance, the surface mount technology disclosed herein will facilitate automated assembly which will reduce the expense of manufacturing R.F. and microwave systems. Similarly, the surface mount technology provides a more rugged packaging for the device.

The assembly 10 is able to package existing microwave devices such as amplifiers, attenuators, mixers, and limiters in a TO-8 compatible package. These thin film substrate and off-board components are placed directly into the assembly 10. Specifically, the devices are supported by the vias 16 above the alumina base 14 and are thereby protected by the remainder of the assembly 10.

Thus it is apparent that there has been presented, in accordance with the invention, a surface mount TO-8 package assembly for R.F. and microwave devices, that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and scope of the appended claims.

WHAT IS CLAIMED:

1. A surface mount TO-8 package assembly for microwave devices comprising
   a ceramic base,
   a lead-frame having leads in a TO-8 configuration carried on one face of said base,
   a plurality of metal vias, positioned in said base, which serve to electrically connect to a device carried at the other face of said base,
   side walls extending upwardly from said other face of said base, and
   a cover secured to said side walls to define with said walls and base an enclosure for an R.F. or microwave device.

2. The assembly of Claim 1 wherein said lead-frame is goldplated nickel alloy 42.

3. The assembly of Claim 1 wherein said ceramic base is formed of alumina.

4. The assembly of Claim 1 wherein said vias are formed of solid metal.

5. The assembly of Claim 1 wherein said walls are formed of a gold plated Kovar seal-ring positioned above said base.

6. The assembly of Claim 5 wherein said base and said seal-ring are brazed to one another.

7. The assembly of Claim 5 wherein said solid nickel cover is seam welded to the seal-ring.

8. A surface mount TO-8 package assembly for microwave devices, wherein at least one of said devices is positioned in said assembly which comprises
   an alumina base,
   a gold plated lead-frame secured to one face of said base and having leads in a TO-8 configuration,
   a plurality of solid metal vias, positioned in said base, extending from said one face of said base to its other face,
   said vias electrically connecting a device within said package to said lead-frame,
   a gold plated Kovar seal-ring, positioned above and brazed to said alumina base, and
   a cover positioned above and welded to said seal-ring.

* * * * *